(12) United States Patent
Georgescu

(10) Patent No.: US 6,617,642 B1
(45) Date of Patent: Sep. 9, 2003

(54) FIELD EFFECT TRANSISTOR STRUCTURE FOR DRIVING INDUCTIVE LOADS

(75) Inventor: Sorin Stefan Georgescu, San Jose, CA (US)

(73) Assignee: Tripath Technology, Inc., San Jose, CA (US)

( * ) Notice: Subject to any disclaimer, the term of this patent is extended or adjusted under 35 U.S.C. 154(b) by 0 days.

(21) Appl. No.: 09/690,926

(22) Filed: Oct. 17, 2000

Related U.S. Application Data

(60) Provisional application No. 60/184,215, filed on Feb. 23, 2000.

(51) Int. Cl.[7] .................. H01L 29/76; H01L 29/94; H01L 31/062; H01L 27/095; H01L 29/47
(52) U.S. Cl. .................. 257/335; 257/339; 257/343; 257/471
(58) Field of Search .................. 257/335, 328, 257/341, 345, 394, 546, 339, 342, 474, 471, 338, 343; 327/139; 307/140; 363/132, 16; 323/284

(56) References Cited

U.S. PATENT DOCUMENTS

| | | | |
|---|---|---|---|
| 4,866,492 A | 9/1989 | Quigg | 357/23.4 |
| 4,989,127 A | 1/1991 | Wegener | 363/16 |
| 5,268,586 A | 12/1993 | Mukherjee et al. | 257/335 |
| 5,377,094 A | 12/1994 | Williams et al. | 363/132 |
| 5,747,972 A | 5/1998 | Baretich et al. | 323/223 |
| 5,925,910 A | 7/1999 | Menegoli | 257/335 |

FOREIGN PATENT DOCUMENTS

| | | | | |
|---|---|---|---|---|
| JP | 7-15009 | * | 1/1995 | H01L/29/78 |

OTHER PUBLICATIONS

Ng, Complete Guide to Semiconductor Devices, 1995, Mcgraw–Hill, Inc, pp. 30–39.*
A.Y.C. Yu, Electron Tunneling and Contact Resistance Metal–Silicon Contact Barriers, Solid–State Electronics, Pergamon Press 1970, vol. 13, pp. 239–247.
Arthur J. Learn, Evolution and Current Status of Aluminum Metallization, J. Electrochem. Soc.: Solid–State Science and Technology, Jun. 1976, pp. 894–906.
Jenny M. Ford, Al/Poly Si Specific Contact Resistivity, IEEE Electron Device Letters, vol. EDL–4, No. 7, Jul. 1983, pp. 255–257.
Kwok K. Ng, Complete Guide to Semiconductor Devices, McGraw–Hill, Inc., 1995, pp. 30–39.

* cited by examiner

*Primary Examiner*—Shouxiang Hu
(74) *Attorney, Agent, or Firm*—Beyer Weaver & Thomas LLP

(57) ABSTRACT

The field effect transistor of the present invention includes a body diffusion region having a source diffusion region therein. The field effect transistor further includes a metal source contact adjacent the body diffusion region and the source diffusion region. The metal source contact forms a Schottky type contact with the body diffusion region.

16 Claims, 9 Drawing Sheets

Power NFET

Power PFET

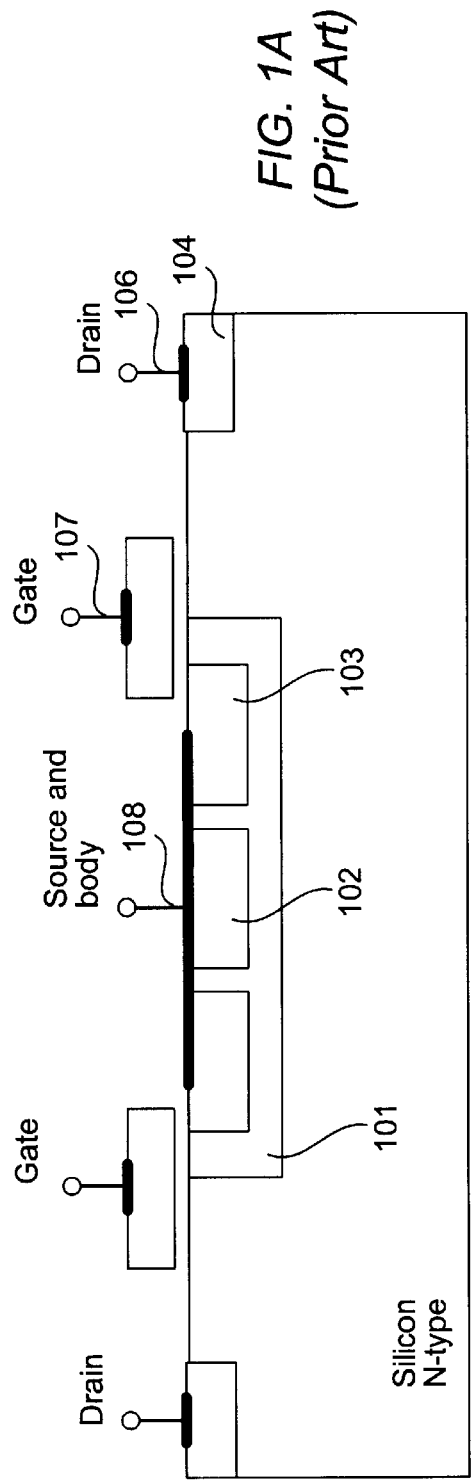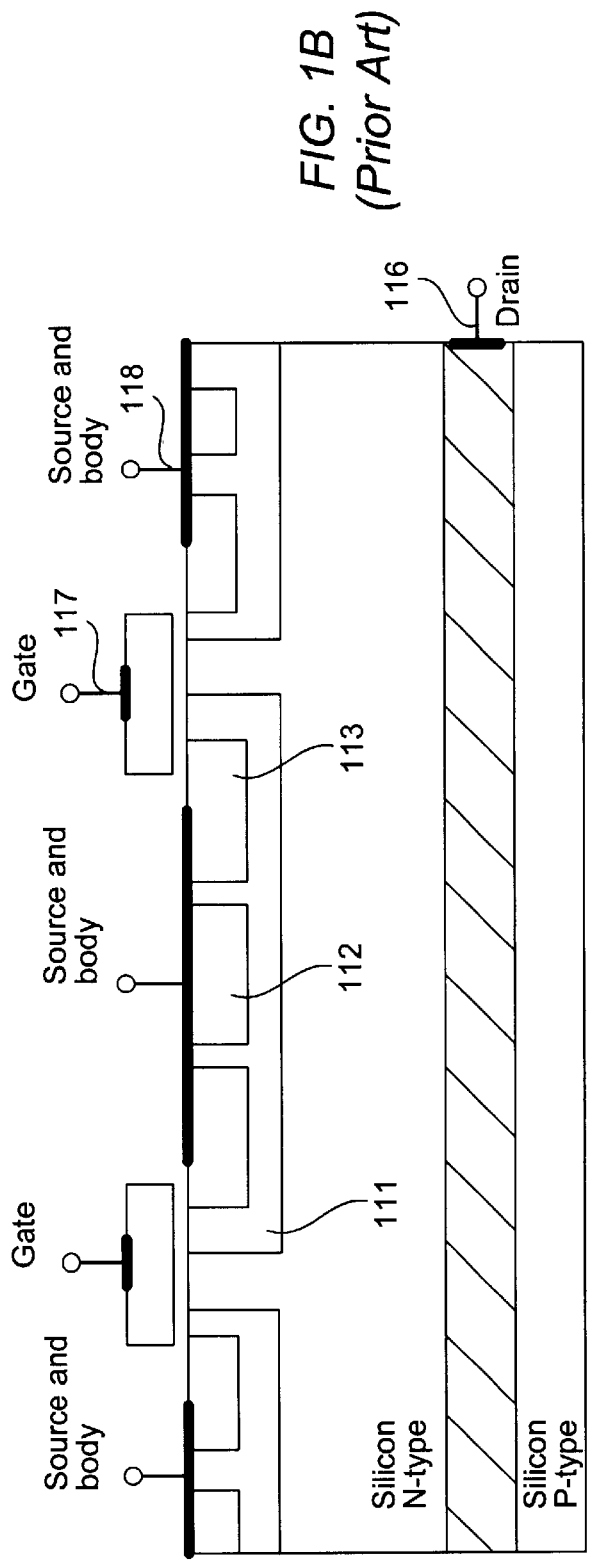

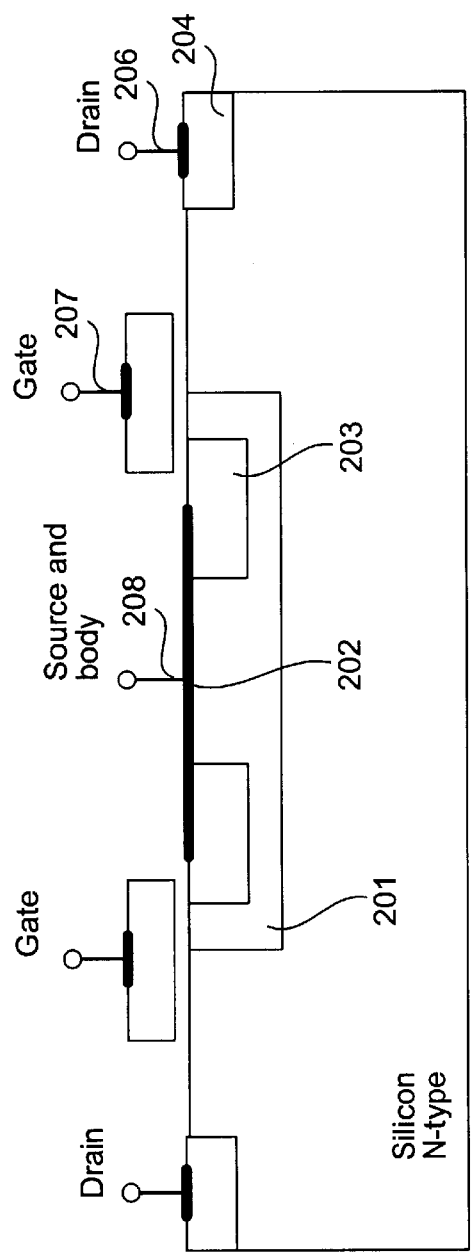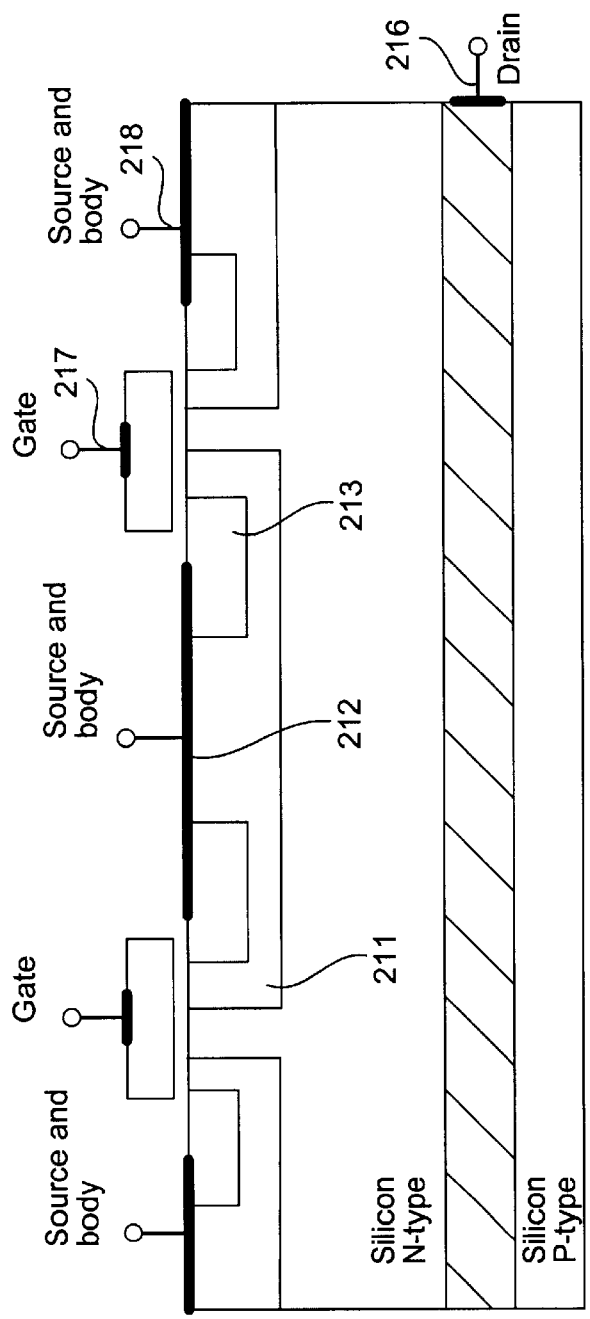

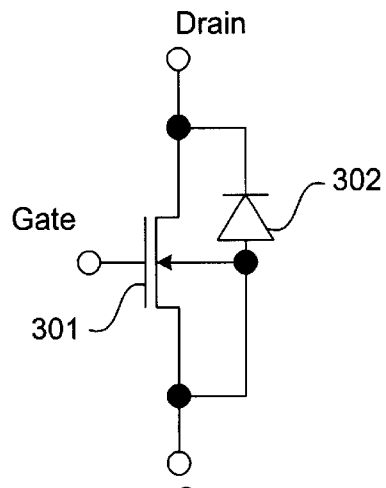
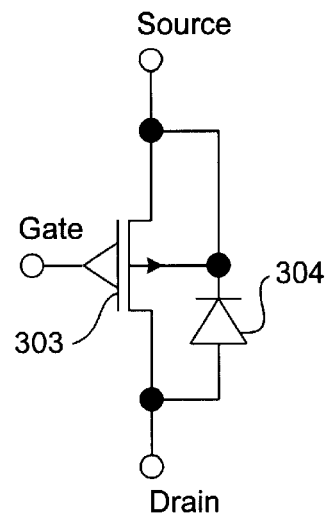
Power NFET        Power PFET
FIG. 3
*(Prior Art)*
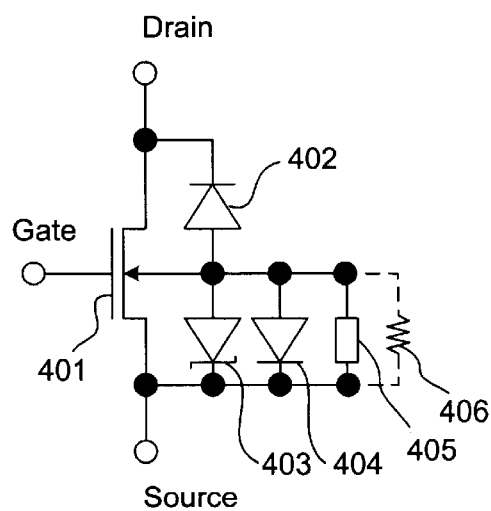
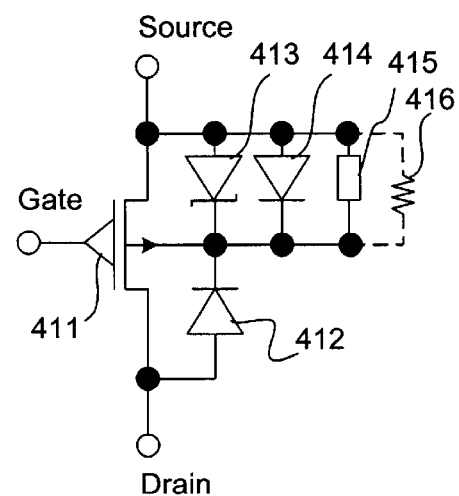
Power NFET        Power PFET
FIG. 4

FIELD EFFECT TRANSISTOR STRUCTURE FOR DRIVING INDUCTIVE LOADS

RELATED APPLICATION DATA

The present application claims priority from U.S. Provisional Patent Application No. 60/184,215 for METHOD AND CIRCUIT TO OBTAIN HIGH FREQUENCY SWITCHING POWER FET STAGE FOR INDUCTIVE LOADS filed on Feb. 23, 2000, the entirety of which is incorporated herein by reference for all purposes.

BACKGROUND OF THE INVENTION

The present invention relates to an improved structure for field effect transistors (FETs). More specifically, an improved FET structure is proposed for high frequency switching applications into inductive loads.

There are many applications that require switching current in inductive loads. For many power and high frequency switching applications, a typical output stage has power MOSFET transistors, usually the NMOS type. For convenience, the power FET of the NMOS type will also be referred to herein as an NFET. Similarly, the power FET of the PMOS type will also be referred to herein as a PFET. FIGS. 1a and 1b show cross sections through generic power NFET transistors with current flowing in the lateral and vertical directions, respectively. Referring to FIG. 1a, the voltage on the gate 107 controls the lateral current flow towards drain contact 106. The body diffusion region 101 contains the N+ source diffusion 103 and the P+ contact diffusion 102. The source N+103 and the body P+ 102 are normally shorted by the source metal, thus allowing the body capacitors to be easily charged and discharged.

Similarly, for the vertical NFET shown in FIG. 1b, the gate 117 controls the lateral current flow which then turns to the vertical direction to be collected by the buried drain 116. Again, the body diffusion 111 contains the N+ source diffusion 113 and the P+ contact diffusion 112. For the same reason mentioned above, the body P+ 112 is shorted to the source N+ 113 through the source metal. It will be understood that above discussion also applies to the PFET transistor with the provision that the diffusion types are interchanged and the voltages and currents are reversed.

FIG. 1c shows another NFET structure which includes a Schottky diode between body and drain. The DMOS part of this structure operates similarly to the devices in FIGS. 1a and 1b, having main body diffusion 121, P+ contact diffusion 122, the N+ source diffusion 123, and the drain diffusion 126. The gate electrode 127 controls the current conduction of the DMOS device. Two additional p-body diffusions 124 shield the vertical Schottky diode formed on top of the epitaxial layer.

FIG. 3 shows the usual schematic symbol used for power FETs. The power NFET 301 is depicted with a body diode 302 between body and drain. Similarly the PFET 303 is shown with the body diode 304 connected to the drain. Using power FETs to switch currents through inductive load allows fast switching time and lower power dissipation. Some common configurations for power stages intended to drive inductive loads are shown in FIGS. 5a and 5b which illustrate an NFET only configuration and a complementary FET configuration, respectively. The low side NFET in either configuration (i.e., NFET 503 or 513) has an internal source-drain diode (504 or 514), which is the actual body/drain junction. On the high side, the power NFET 501 (or PFET 511) has an internal source/drain diode 502 (or 512). The load consists of an inductor 505 (or 515) in series with load impedance 506 (or 516).

During switching, only one power device in each configuration is allowed be conductive, to avoid shoot-through currents. The inductive load forces the output node voltage to go outside the rail voltage, i.e., above the rail 507 (or 517) and below rail 508 (or 518). The voltage swing is clamped by the diodes 502 and 504 (or 512 and 514). As will be understood, a significant drawback of such configurations is due to the large charge storage in the internal body diodes of the power devices which become forward biased when the inductive voltage swing is clamped to the rails. This diode charge storage severely increases the power dissipation as well as aggravates the voltage spikes due to parasitic wire inductance in the circuit.

The usual solution to this charge storage problem is to use external Schottky diodes 509 and 510 (or 519 and 520) between the output node and the rails. Unfortunately, this solution adds significant costs to the power circuit and imposes severe constraints on the board layout as any parasitic inductance can increase the voltage spike on the intrinsic transistor and can turn on its internal diode. Even with the best board layout the series lead inductance of the external Schottky diodes can produce significant charge injection and attendant power losses in the power transistors.

The integration of a Schottky source-drain diode as discussed above with reference to FIG. 1c has been suggested as a solution. In principle, such a solution would reduce most of the charge injection in the epitaxial layer by diverting the forward current through the Schottky source-drain diode. However, this method has two important drawbacks: the Schottky source-drain diode significantly increases the device area, and the Schottky contact has to be of very high quality to sustain the high voltage between the drain and the source.

In view of the foregoing, there is a need for providing efficient, integrated solutions for switching inductive loads which mitigate the effects of the internal body diodes of switching devices.

SUMMARY OF THE INVENTION

According to the present invention, switching device structures and switching circuits are provided which avoid the above-described disadvantages. According to specific embodiments, the use of external freewheeling diodes is obviated by the use of the power FETs themselves as clamping devices during inductive spikes. According to such embodiments, a power FET configuration is provided in which the body diode does not turn on when the output potential goes outside the rail voltage range. Rather, the FET itself turns on and the inductor current is directed through the MOSFET channel rather than the bipolar body diode. This saves the cost of external clamping diodes, enables increases in the frequency of operation, and reduces switching power losses.

According to a specific embodiment, an improved power FET structure is provided which prevents the turn-on of the device's body diode when driving an inductive load. One NFET embodiment has a Schottky type contact between the source metal and the P-body diffusion region, i.e., there is no P+ diffusion in the P-body region. Similarly, a PFET embodiment has a Schottky contact between the source metal and the N-body region, i.e., there is no N+ diffusion in N-body region.

According to more specific embodiments, the improved power FET of the present invention is used to construct a power stage for driving inductive loads. The circuit may use two NMOS devices for high side and low side drive, or may use a complementary stage with a PFET on the high side and an NFET on the low side. When current is flowing through the low side FET and this FET is switched off, the inductive load forces the output voltage above the high rail. During the switching time, the high side is kept turned off, by shorting the gate to source. However, when the output voltage rises above the high rail voltage, the high side FET turns on as a reverse conducting FET, while the body diode is kept off by the reverse bias of the Schottky contact. As will be understood, a similar analysis applies to the situation in which switching current flowing through the high side FET is turned off and the output voltage is inductively forced below the low rail voltage.

According to another embodiment, a power stage implemented using the improved FETs is switched as described above except that the FET which is near the inductively pumped rail is actively turned on by applying a corresponding gate voltage. According to a more specific embodiment, this gate turn-on is delayed from the switching edge such that an even greater reduction in power loss may be achieved while avoiding the risk of shoot through currents.

Thus, the present invention provides a field effect transistor which includes a body diffusion region having a source diffusion region therein. The field effect transistor further includes a metal source contact adjacent the body diffusion region and the source diffusion region. The metal source contact forms a Schottky type contact with the body diffusion region. According to another embodiment, this field effect transistor structure is employed for the high and low side devices in a circuit for driving inductive loads.

According to still another aspect of the invention, a method for driving an inductive load using a low side field effect transistor and a high side field effect transistor is provided. Each of the low side and high side field effect transistors includes a body diffusion region having a source diffusion region therein. Each field effect transistor also includes a metal source contact adjacent the body diffusion region and the source diffusion region which forms a Schottky type contact with the body diffusion region. Where one of the low side and high side field effect transistors is operating in a reverse mode conduction due to an inductive spike, a turn-on voltage is applied to the one of the transistors following a predetermined delay from the other of the transistors being turned off. Application of the turn-on voltage reduces the on-resistance of the one of the transistors.

A further understanding of the nature and advantages of the present invention may be realized by reference to the remaining portions of the specification and the drawings.

BRIEF DESCRIPTION OF THE DRAWINGS

FIG. 1a shows a cross section through a generic N-channel lateral power FET transistor.

FIG. 1b shows a cross section through a generic N-channel vertical power FET transistor.

FIG. 2a shows a cross section through a lateral power NFET transistor designed according to a specific embodiment of the present invention.

FIG. 2b shows a cross section through a vertical power NFET transistor designed according to a specific embodiment of the present invention.

FIG. 3 shows common symbols for standard power FET devices.

FIG. 4 shows the schematic symbols for the power FET devices of the present invention.

DETAILED DESCRIPTION OF SPECIFIC EMBODIMENTS

Figure 1C:
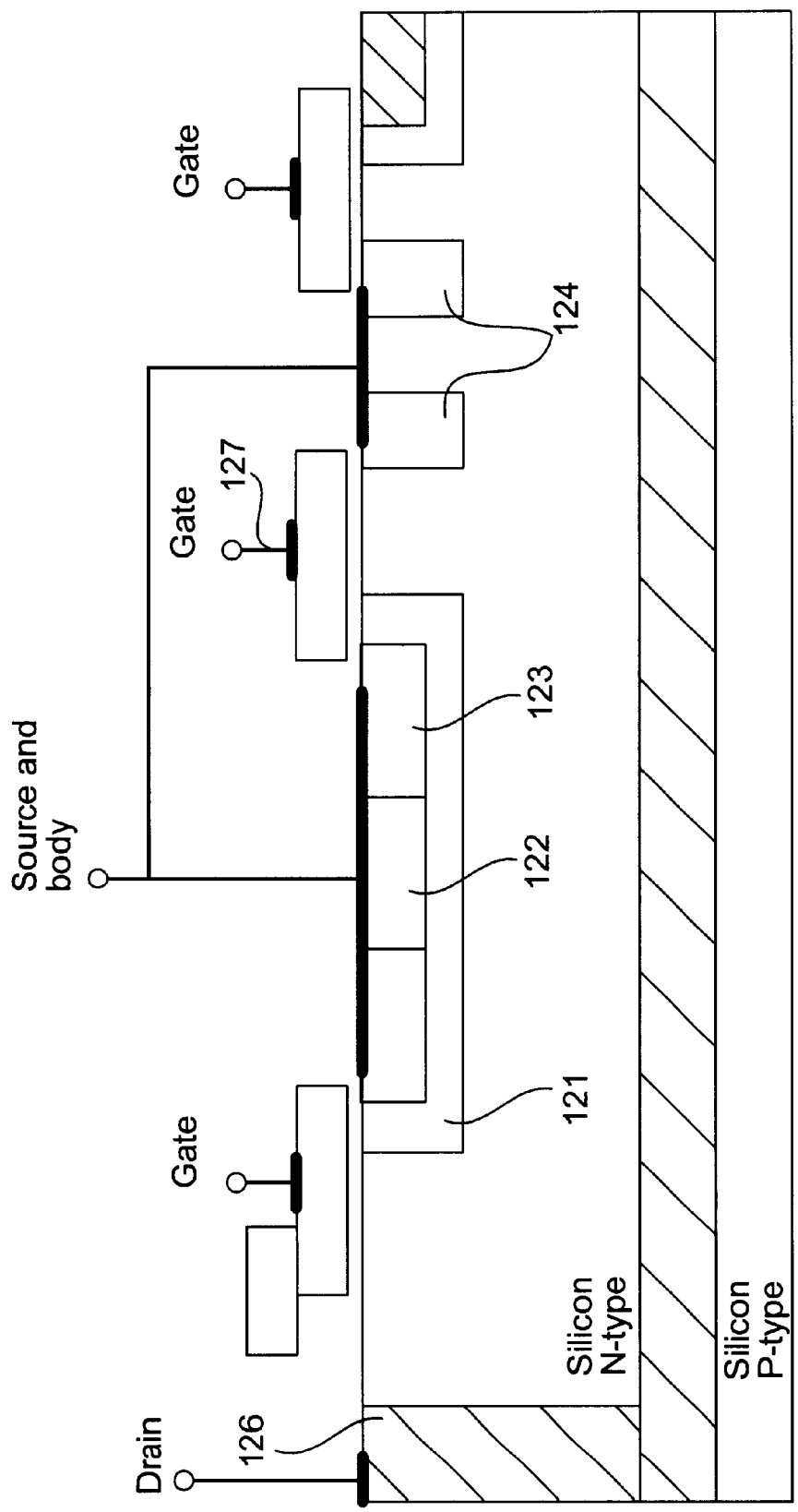
FIG. 1c shows a cross section through a power FET transistor with an integrated Schottky diode between drain and source.
Figure 5A:
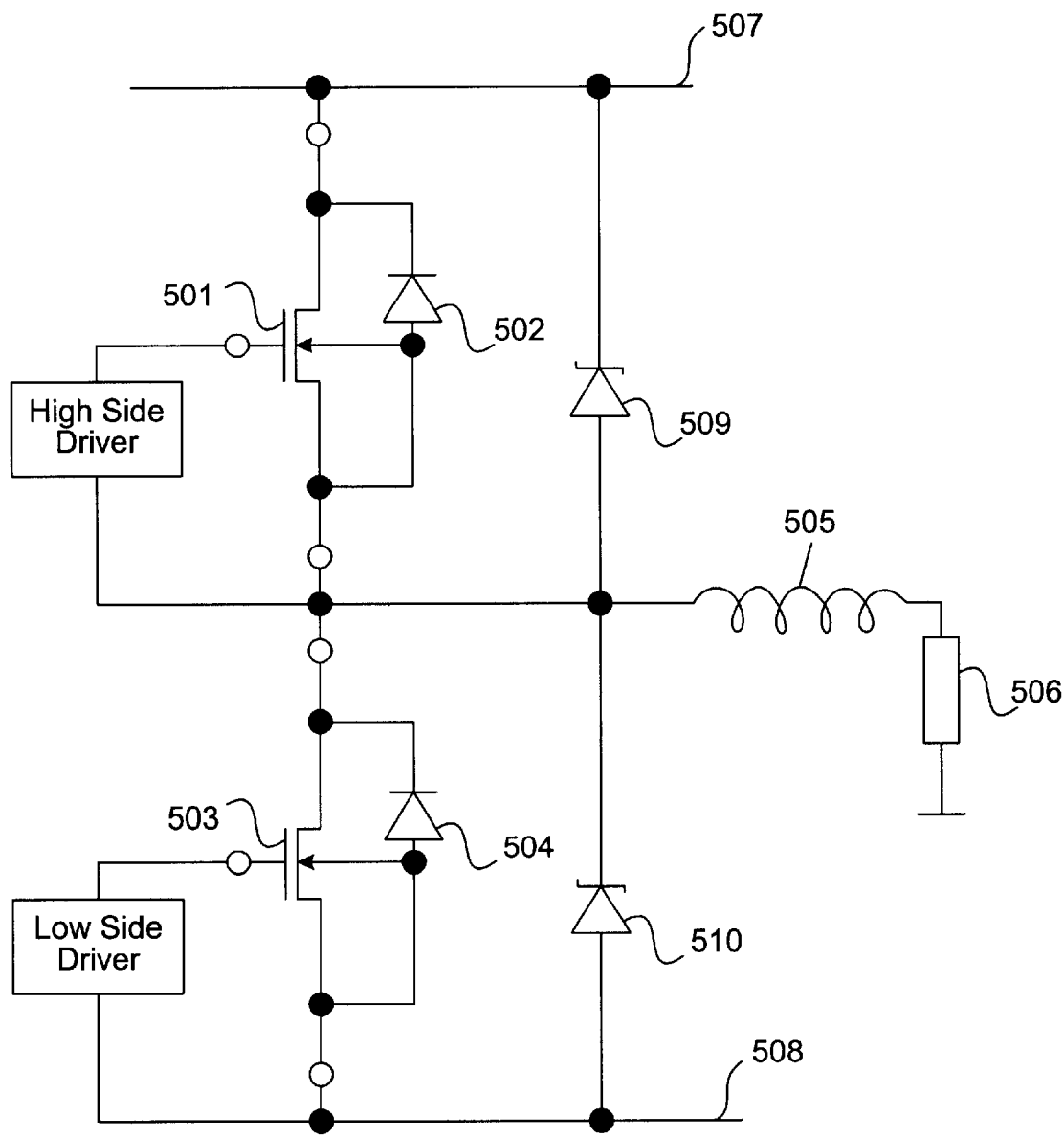
FIG. 5a is a simplified schematic of a first type of standard inductive load power stage.
Figure 5B:
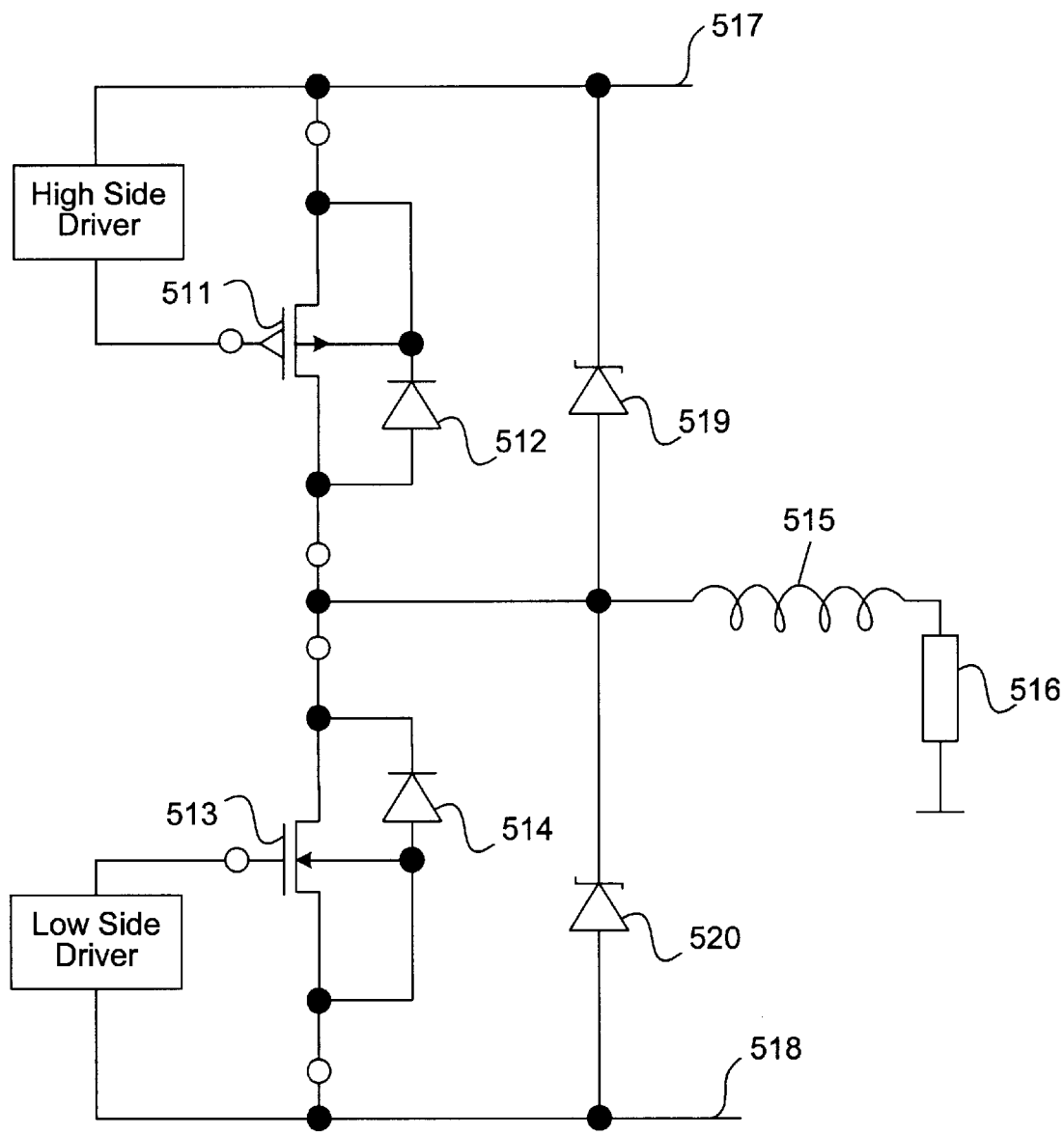
FIG. 5b is a simplified schematic of a second type of standard inductive load power stage.

Improved power FET structures are described herein together with circuits employing such devices. Although many details are given in the following description, it will be evident to those skilled in the relevant arts that the present invention can be practiced without some of the specific details described.

Examples of power FET structures designed according to specific embodiments of the present invention are shown in FIGS. 2a and 2b. These figures represent cross sections through power NFETs for both lateral and vertical DMOS types, respectively. Although not shown, similar structures and principles of operation apply for power PFET designed according to the invention. The structure shown differs from a standard DMOS structure in that a Schottky type contact 202 (or 212) is created between source 208 (or 218) and p-body 201 (or 211), i.e., the P+ contact implant under the source metal is eliminated. This Schottky contact (i) prevents the turn-on of the drain/p-body junction diode, and (ii) prevents the source/p-body junction diode from turning on due to low voltage turn-on, usually less than 0.3V. According to various embodiments, the Schottky contact electrical characteristics (e.g., turn-on and breakdown voltages) may be tuned for optimal performance using local implants in the body contact area. Determining the correct implant dose is a well known procedure for those skilled in the art of semiconductor processing.

Thus, this NFET configuration prevents bipolar injection inside the power device, regardless of its external bias. Indeed, as will be understood with reference to FIG. 4, when the source is biased above the drain (for an NFET), the Schottky diode 403 is reverse biased thus preventing any significant current from going into the drain/p-body diode 402 which is forward biased. Similarly, for a PFET structure, when the drain is biased above the source, the Schottky diode 413 is reverse biased thus preventing the turn-on of diode 412. It should be noted that the requirements for the integrated Schottky diodes are relatively relaxed: (1) the breakdown voltage has to be above the threshold voltage of the FET (4–5 V is normally enough), and (2) the leakage current can be quite high as long as it is much smaller than the current going through the load.

According to various embodiments, a certain degree of leakage is employed to charge the body capacitors. The equivalent resistance of the Schottky diode leakage is represented in FIG. 4 by the resistor 405 (or 415). According to more specific embodiments, if the Schottky leakage is too small, a resistor (406 or 416) may be incorporated by allowing a few small ohmic contacts between source metal and p-body. According to another specific embodiment, a silicide glue layer (e.g., titanium silicide or tungsten silicide), provides the Schottky contact between the source metal and the body diffusion region.

Figure 6A:
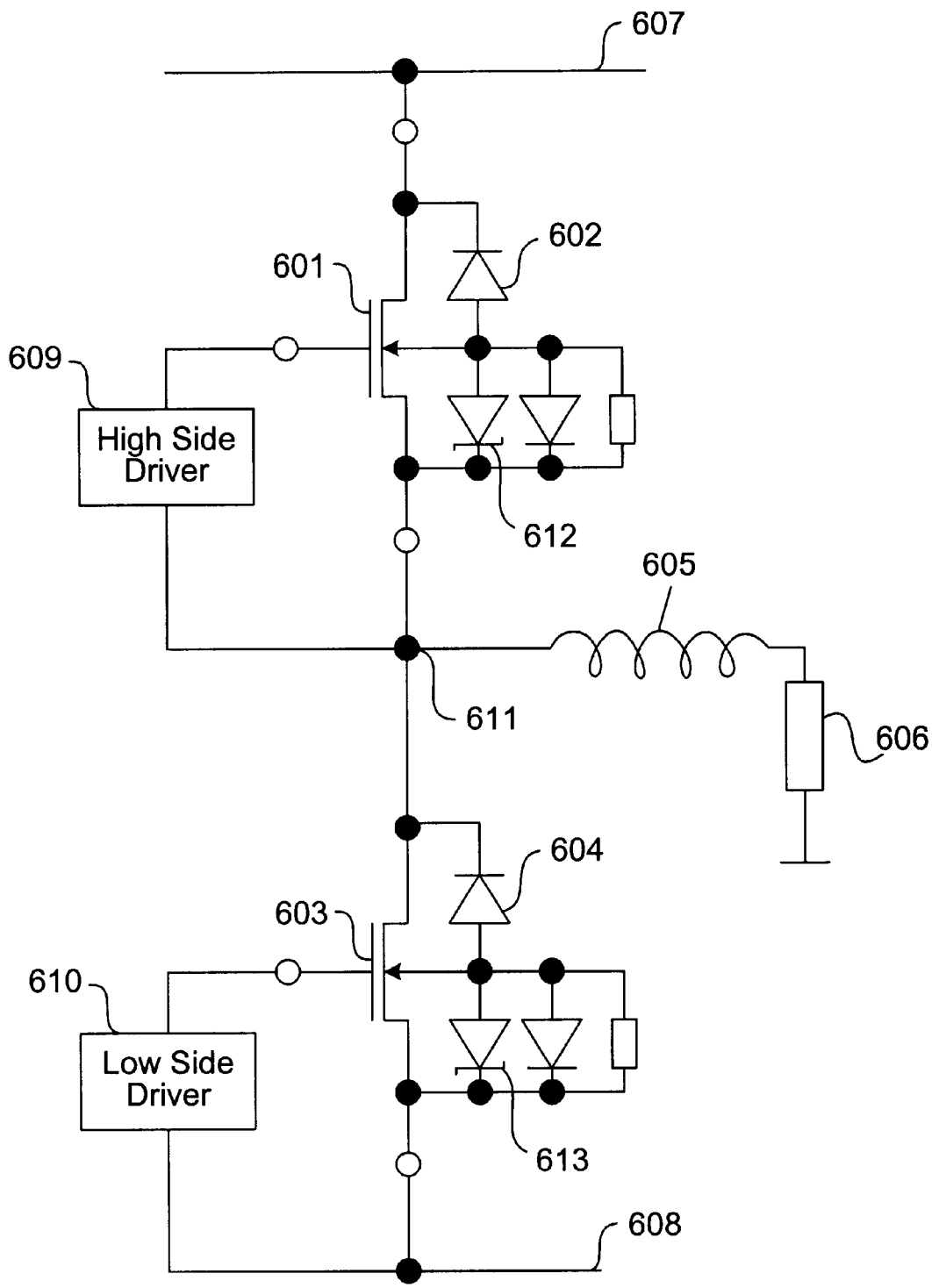
FIG. 6a is a simplified schematic of a first type of inductive power stage designed according to the present invention.
Figure 6B:
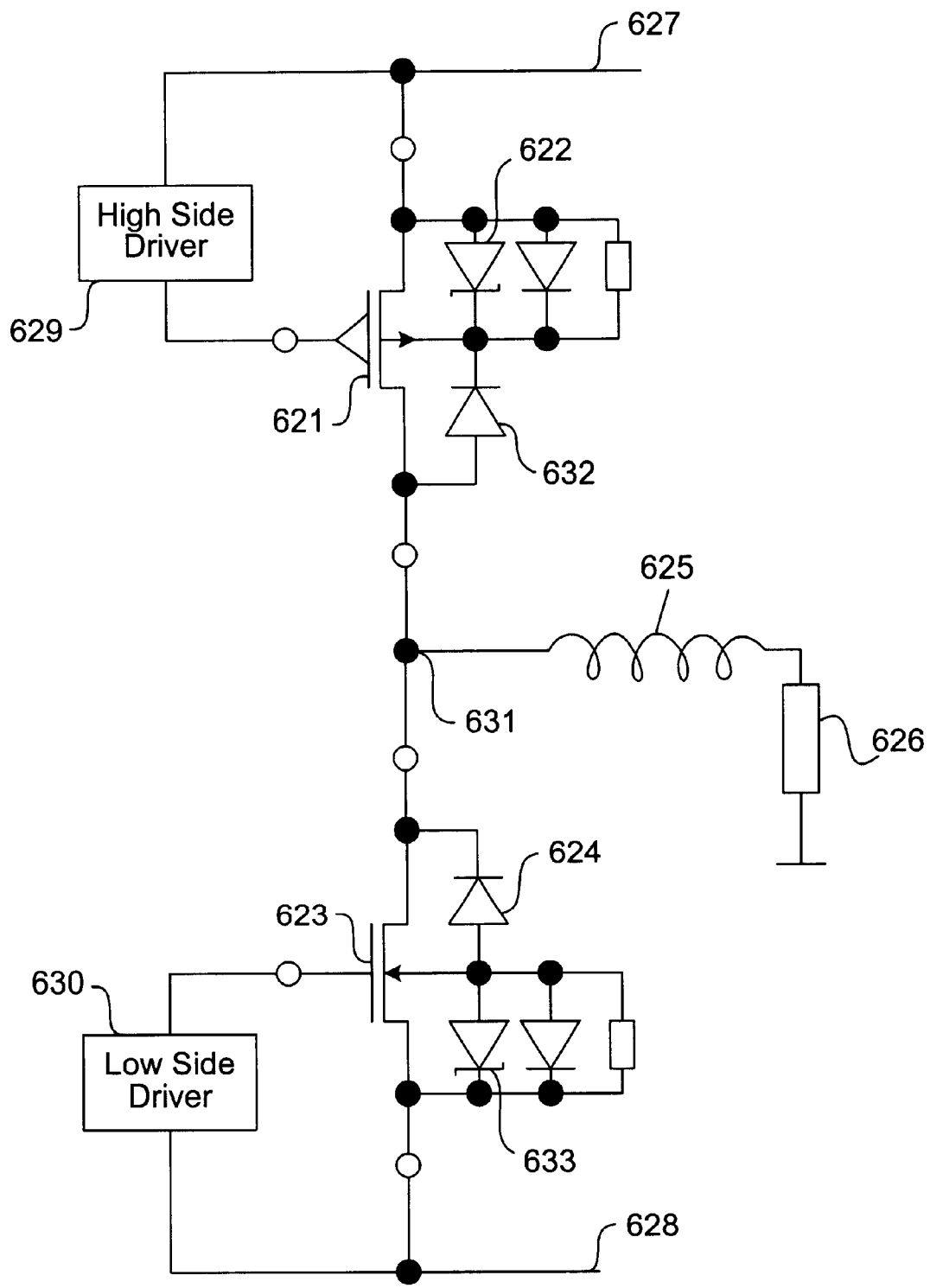
FIG. 6b is a simplified schematic of a second type of inductive power stage designed according to the present invention.

The power FET structures of the present invention may be used as the basis for a power stage for driving inductive loads. Simplified schematics of such circuits are shown in FIGS. 6a and 6b which illustrate an NFET-only design and a complementary design, respectively. In normal switching operation of this power stage only one of the devices is turned on at any given time to prevent high shoot through currents and unnecessary power losses. For example, when the low side device 603 (or 623) is turned on by the low side driver 610 (or 630), a large current may flow into the load 606 (or 62). When the low side device is turned off, the inductor 605(or 62) forces the output node voltage 611 (or 631) above the high rail 607 (or 627) in order to keep the current constant.

During this time and although the gate is shorted to source, the high side FET is reverse biased and actually swaps source with drain. Due to the fact that the body diode injection is suppressed by the Schottky diode 612 (or 632), the high side FET 601 (or 621) turns on when the gate voltage (which is equal to the new drain voltage) passes the threshold voltage. During all this time the high side driver 609 (or 629) ensures that the gate is shorted to source. However, according to one aspect of the present invention, the circuit turns on the high side FET 609 (or 629) automatically such that external free wheeling diodes are no longer needed.

Similarly, when the high side FET is conducting due to a gate voltage applied by high side driver 609 (or 629) and is then turned off by the driver, the output node voltage 611 (or 631) is forced below the rail 608 (or 628). In this case the low side NFET 603 (or 623) automatically turns on by the action of the Schottky diode 613 (or 633) even though the gate is shorted to source by the low side driver 610 (or 630).

Figure 7:
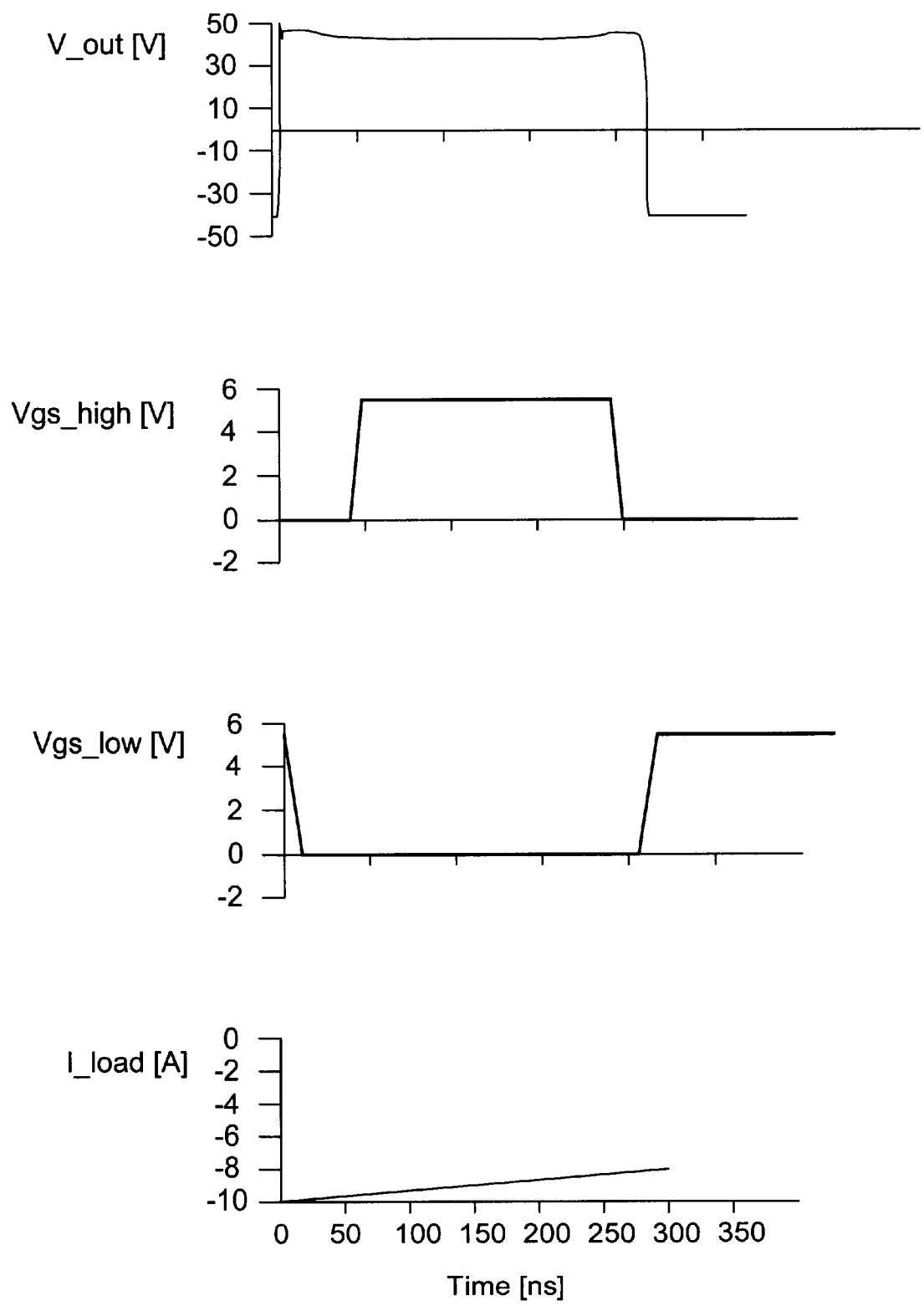
FIG. 7 is a simplified diagram of waveforms associated with switching an inductive power stage designed according to the present invention.

In another embodiment, a power FET designed according to the present invention may be actively turned on when in the reverse mode conduction. For example, when the high side transistor 601 of FIG. 6a is reverse biased due to the inductive voltage swing, the high side driver may be configured to apply a positive gate voltage pulse. This additional bias of the gate further reduces the on resistance of the power FET and thereby reduces the power dissipation. Similarly, when the inductive voltage swing is negative, the low side driver may be configured to apply a positive voltage pulse on the gate of transistor 603. To illustrate the operation, the waveforms and timing are shown in FIG. 7 for the case of the switching stage shown in FIG. 6a. At t=0 ns, the load current 702 has a high value (e.g., about 1 A). The gate voltage 701 is turned off for the low side driver and the inductive load forces output voltage Vout 704 above the rail (which is about 45V). The high side transistor then conducts in the reverse direction although its gate is shorted to source. The reverse drain to source voltage is about 1 V above the threshold voltage of the power FET so the power dissipation is small. Also, the high side FET is actively turned on after a preprogrammed delay following the low side FET turn off, as shown in the Vgs high waveform 703. This further reduces the drain to source voltage of the high side FET and the power dissipation as well. A similar delay is introduced when turning on the low side power FET, i.e., the high side power FET is turned off before the low side transistor is turned on. This "break-before-make" delay can be safely preprogrannned in the range of a few nanoseconds to a few tens of nanoseconds as dictated by specific applications.

While the invention has been particularly shown and described with reference to specific embodiments thereof, it will be understood by those skilled in the art that changes in the form and details of the disclosed embodiments may be made without departing from the spirit or scope of the invention. Therefore, the scope of the invention should be determined with reference to the appended claims.

What is claimed is:

1. A field effect transistor, comprising a body diffusion region having a source diffusion region therein, the field effect transistor further comprising a metal source contact adjacent the body diffusion region and the source diffusion region, the metal source contact forming a Schottky type contact with the body diffusion region, the field effect transistor further comprising an additional resistor in parallel with the Schottky type contact for facilitating an additional leakage beyond a Schottky leakage, the Schottky leakage corresponding to an equivalent resistance of the Schottky type contact, wherein the additional resistor comprises a few small ohmic contacts between the metal source contact and the body diffusion region.

2. The field effect transistor of claim 1 wherein the field effect transistor is configured as a lateral device.

3. The field effect transistor of claim 1 wherein the field effect transistor is configured as a vertical device.

4. The field effect transistor of claim 1 wherein the field effect transistor is an n-type field effect transistor and the body diffusion region is a p-type region and the source diffusion region is an n-type region.

5. The field effect transistor of claim 1 wherein the field effect transistor is a p-type field effect transistor and the body diffusion region is an n-type region and the source diffusion region is a p-type region.

6. The field effect transistor of claim 1 wherein the Schottky type contact is formed using a silicide glue layer.

7. A circuit for driving an inductive load, comprising
a low side field effect transistor having a first source terminal connected to a low side power supply rail and a first drain terminal for connecting to the inductive load, the low side field effect transistor comprising a first body diffusion region having a first source diffusion region therein, the low side field effect transistor further comprising a first metal source contact adjacent the first body diffusion region and the first source diffusion region and corresponding to the first source terminal the first metal source contact forming a first Schottky type contact with the first body diffusion region, the low side field effect transistor further comprising a first additional resistor in parallel with the first Schottky type contact for facilitating a first additional leakage beyond a first Schottky leakage, the first Schottky leakage corresponding to a first equivalent resistance of the first Schottky type contact wherein the first additional resistor comprises a few small ohmic contacts between the first metal source contact and the first body diffusion region; and
a high side field effect transistor having a second source terminal connected to a high side power supply rail and a second drain terminal for connecting to the inductive load, the high side field effect transistor comprising a second body diffusion region having a second source diffusion region therein, the high side field effect transistor further comprising a second metal source contact adjacent the second body diffusion region and the second source diffusion region and corresponding to the second source terminal, the second metal source contact forming a second Schottky type contact with the second body diffusion region, the high side field effect transistor further comprising a second additional resistor in parallel with the second Schottky type contact for facilitating a second additional leakage beyond a second Schottky leakage, the second Schottky leakage corresponding to a second equivalent resistance of the second Schottky type contact, wherein the second additional resistor comprises a few small ohmic contacts between the second metal source contact and the second body diffusion region.

8. The circuit of claim 7 wherein each of the field effect transistors is configured as a lateral device.

9. The circuit of claim 7 wherein each of the field effect transistors is configured as a vertical device.

10. The circuit of claim 7 wherein the high side field effect transistor comprises a p-type field effect transistor and the second body diffusion region is an n-type region and the second source diffusion region is a p-type region, and wherein the low side field effect transistor comprises an n-type field effect transistor and the first body diffusion region is a p-type region and the first source diffusion region is an n-type region.

11. The circuit of claim 7 wherein the first and second Schottky type contacts are formed using first and second silicide glue layers.

12. A circuit for driving an inductive load, comprising:

a low side field effect transistor having a first source terminal connected to a low side power supply rail and a first drain terminal for connecting to the inductive load, the low side field effect transistor comprising a first body diffusion region having a first source diffusion region therein, the low side field effect transistor further comprising a first metal source contact adjacent the first body diffusion region and the first source diffusion region and corresponding to the first source terminal, the first metal source contact forming a first Schottky type contact with the first body diffusion region, the low side field effect transistor further comprising a first additional resistor in parallel with the first Schottky type contact for facilitating a first additional leakage beyond a fist Schottky leakage, the first Schottky leakage corresponding to a first equivalent resistance of the first Schottky type contact, wherein the first additional resistor comprises a few small ohmic contacts between the first metal source contact and the first body diffusion region; and a high side field effect transistor having a second drain terminal connected to a high side power supply rail and a second source terminal for connecting to the inductive load, the high side field effect transistor comprising a second body diffusion region having a second source diffusion region therein the high side field effect transistor further comprising a second metal source contact adjacent the second body diffusion region and the second source diffusion region and corresponding to the second source terminal, the second metal source contact forming a second Schottky type contact with the second body diffusion region, the high side field effect transistor further comprising a second additional resistor in parallel with the second Schottky type contact for facilitating a second additional leakage beyond a second Schottky leakage, the second Schottky leakage corresponding to a second equivalent resistance of the second Schottky type contact, wherein the second additional resistor comprises a few small ohmic contacts between the second metal source contact and the second body diffusion region.

13. The circuit of claim 12 wherein both of the field effect transistors comprise n-type field effect transistors and the first and second body diffusion regions are p-type regions and first and second source diffusion regions are n-type regions.

14. The circuit of claim 12 each of the field effect transistors is configured as a lateral device.

15. The circuit of claim 12 wherein each of the field effect transistors is configured as a vertical device.

16. The circuit of claim 12 wherein the first and second Schottky type contacts are formed using first and second silicide glue layers.

* * * * *